(12) United States Patent
Shepard

(10) Patent No.: US 8,635,426 B2
(45) Date of Patent: Jan. 21, 2014

(54) DIAGONALLY ACCESSED MEMORY ARRAY CIRCUIT

(76) Inventor: Daniel Robert Shepard, North Hampton, NH (US)

( * ) Notice: Subject to any disclaimer, the term of this patent is extended or adjusted under 35 U.S.C. 154(b) by 224 days.

(21) Appl. No.: 12/925,934

(22) Filed: Nov. 2, 2010

(65) Prior Publication Data

US 2011/0107055 A1   May 5, 2011

Related U.S. Application Data

(60) Provisional application No. 61/280,457, filed on Nov. 4, 2009.

(51) Int. Cl.
*G06F 12/00* (2006.01)
(52) U.S. Cl.
USPC ............. 711/202; 711/115; 711/E12.069; 711/219; 714/768; 365/230.06
(58) Field of Classification Search
USPC ........................................................ 711/200
See application file for complete search history.

(56) References Cited

U.S. PATENT DOCUMENTS

| | | | | |
|---|---|---|---|---|
| 4,122,542 A * | 10/1978 | Camerik et al. | ............... | 365/156 |
| 5,943,283 A * | 8/1999 | Wong et al. | ............... | 365/230.01 |
| 6,584,029 B2 * | 6/2003 | Tran et al. | .................. | 365/225.7 |
| 6,920,528 B1 * | 7/2005 | Chan | ............................. | 711/115 |
| 7,185,173 B2 * | 2/2007 | Ho | ................................. | 711/220 |
| 7,634,585 B2 * | 12/2009 | Conley et al. | .................... | 710/1 |

* cited by examiner

*Primary Examiner* — Reginald Bragdon
*Assistant Examiner* — Hamdy S Ahmed

(57) ABSTRACT

A memory-array decoder operably coupled to a memory array comprising a sequence of rows and receiving as input a plurality of address bits whereby these address bits are transformed by transforming logic. This transforming logic may include adders. Transforming logic may alternately include comparators or exclusive-or circuits. Transforming logic comprising adders may include overflow carry bits that are discarded, ignored, or otherwise not used or the overflow logic may be omitted altogether.

19 Claims, 2 Drawing Sheets

DIAGONALLY ACCESSED MEMORY ARRAY CIRCUIT

CROSS-REFERENCE TO RELATED APPLICATION

This application claims priority to and the benefit of, and incorporates herein by reference in its entirety, U.S. Provisional Patent Application No. 61/280,457 by Shepard titled "Diagonally Accessed Memory Array Circuit" which was filed on Nov. 4, 2009. This application makes reference to and incorporates herein by reference in its entirety, U.S. Pat. No. 7,149,934, by Shepard titled "Error Correcting Memory Access Means and Method" that issued on Dec. 12, 2006.

TECHNICAL FIELD

In various embodiments, the present invention relates to memory devices which utilize error correcting, and more particularly to semiconductor memory device circuits designed to facilitate an addressing pattern that is optimized to better facilitate error correcting techniques and reduce device testing.

BACKGROUND

As advances continue to be made in the area of semiconductor memory devices, high capacity and low cost will be increasingly important. In particular, it will be necessary to create memory devices for which the testing of the device must be minimized in order to minimize costs. Current memory testing costs are significant and are expected to grow as the capacity of the devices grows. The cost of the testing can be estimated by dividing the annual amortized plus variable costs of the test equipment by the number of devices tested per year. The higher the memory's capacity, the more storage locations that must be tested, and the longer the testing operation will take. As memory devices enter the Gigabyte range and larger, the number of devices that a given piece of test equipment can test in a given period of time will go down. As a result, the cost per unit attributable to testing should rise. If testing is to be reduced or eliminated while maintaining high manufacturing yields, a new approach to error correcting will have to be employed.

The prior art includes many approaches for correcting errors in memory devices. This is typically accomplished by identifying faults and substituting for them. One approach to error correcting is to thoroughly test the memory device at the time of manufacture, to identify the points of failure within the device and to remap, rewire or reconfigure the device to substitute extra circuitry included in the device for the defective circuits. This can done at the time of manufacture by laser burning the wiring so as to make the circuit substitution. However, this requires that each device be thoroughly tested in order to identify the locations of the faults and this extensive testing can be very expensive, especially when the number of bytes of memory is very large. The subsequent post-manufacturing error correcting of this approach further increases the cost of the device.

Alternatively, logic can be incorporated into the device that can maintain a table of defective bit locations and dynamically substitute functioning storage bits for the bits determined to be defective, and this determination can be made during device operation. But, this requires that the spare bits, at least, be tested for proper operation and each memory must undergo self analysis before it can be used or during ongoing operation of the device. Average device density is also reduced as chip area is consumed by the fault detection and correction circuitry.

Rotating storage media, such as some magnetic disks, CD-ROM and DVD deals with this problem by including enough error correcting bits to fix a predetermined number of flawed bits. With this class of storage device, the individual data bits need not be tested for correctness because the likely worst-case number of bad bits has been calculated in advance and an error correcting algorithm (along with its necessary number of error correcting bits) is selected to ensure that this worst-case number of bad bits can be corrected. In this way, the cost of testing vast quantities of data bits can be avoided along with the associated testing costs. This approach is especially useful for storage devices that operate on data in large blocks or sectors where error correcting techniques are most efficient. Typically, as the size of a block of data increases, the number of error correcting bits increases more slowly; this results in a smaller percentage of error correcting bits as the size of the data block grows. This method of error correcting in a block of data works as long as the number of bad bits does not exceed the correctable number of bad bits as determined by the error correcting algorithm and the number of available error correcting bit.

Semiconductor memories are typically laid out as a two dimensional array having a plurality of row lines and column lines. While it is possible that any given bit in the array is flawed and inoperative, one must also worry about other failure modes. One common failure mode occurs when one of these rows or columns has a break in it thereby making a portion of the array addressed by that row or column inaccessible. Alternatively, another common failure mode occurs when a short circuit exists between adjacent rows, adjacent columns, or a row and a column thereby making it impossible to separately address bits accessed by the shorted together rows or columns. In both of these failure modes, large numbers of data bits can be inaccessible (i.e., all the bits that would be accessed by the flawed row or column). Therefore, as with the application of error correcting for CD-ROM and DVD, too many bits may be lost in a given block of bits for the error correcting algorithm and error correcting bits to be able to correct for these errors. Furthermore, some memories are laid out in more than two dimensions; a third dimension (e.g., vertical stacking where the layers are a third dimension or tiling where the tile selection is a third dimension or both where the stacking and tiling form third and forth dimensions).

Presently, in some applications such as digital photography and music and video playback, to name a few, memory is so expensive that its cost often greatly exceeds the value of the data contained within it. Since data in these examples is accessed in as large blocks, CD-ROM and DVD have become popular because this media is inexpensive. However, CD-ROM and DVD are inconvenient because they are fragile and consume large amounts of power due to their lasers, motors and servo mechanisms.

To better support ECC efficiency, a diagonal access technique (as is disclosed in U.S. Pat. No. 7,149,394 to Shepard, the entire disclosure of which is hereby incorporated by reference herein) can be employed which requires that both the word-line and bit-line advance while a data block is accessed. However, advancing both the word-line and the bit-line is an operation that requires more work than simple incrementing the memory address. Furthermore, locating a memory location somewhere within a data block that is along a diagonal path (or other path according to U.S. Pat. No. 7,149,394) can result in an incorrect location being accessed if one is not careful.

What is needed is an inexpensive memory device where the memory device will cost less than the data stored therein, particularly for those large data applications that happen to access data in large blocks, for which error correcting can be implemented without having to extensively test the device at the time of manufacture and which can be effective for the expected worst case number of bad bits even if row or column line breaks or shorts exist. Furthermore, this needed memory device should facilitate a random-access mode to enable updating just a portion of a data block (as well as its ECC bits) for reading and writing for more efficient operation.

SUMMARY

The present invention is a means and a method for implementing a memory device to better facilitate that diagonal accessing means disclosed in U.S. Pat. No. 7,149,934, by Shepard (the '934 patent). Solid-state memory is typically thought of as working in random-access mode. As such, most solid-state memory is designed for error-free operation. However, many emerging applications require data that is accessed in long blocks. For such applications, these blocks can efficiently utilize error correcting. The '934 patent is a means and a method for accessing the locations in a memory device so as to avoid having error correcting techniques fail due to such common memory device faults as shorts or breaks among the row lines and column lines or as defective data bit storage elements. By enabling error correcting memory to function even when such common flaws exist, testing costs can be significantly reduced while maintaining high device yields. Finally, this addressing approach is applied in the same way regardless of whether the data is being written into or read out of the device.

With high density memory, data is often accessed in blocks. These blocks will often be stored in the memory array such that their first bit location falls on a predetermined column (when the LSB of the address decode to determine the column). A complication exists when the data access seeks to address a storage location that falls within the array as opposed to on the first column.

The present invention is a logic circuit that transforms a memory address such that any given address is adjusted to access memory locations that fall sequentially along a diagonal path or some other path in accordance with U.S. Pat. No. 7,149,394. Many types of electronic circuits exist in the prior art. With any given circuit, there can be many types of different components to implement a given functionality. Many of these circuits are ultimately implemented in a monolithic integrated circuit form.

Embodiments of the present invention may also achieve a diagonal access capability as well as provide the address input to the array row and column decoders. These decoders can have a variety of forms including straight decoder/selectors, multiple stage tree decoders, and decoders which consist of loadable incrementing/advancing selectors, as well as combinations of these. Various embodiments utilize a diode decoder with driver circuit that sequences the row selection automatically with each memory access. As will be clear to one skilled in the art, the same technique may be implemented for one dimension of an array as for another dimension.

In an aspect, embodiments of the invention feature a memory-array decoder preceded by address transforming logic. The decoder receives as input through adder logic a plurality of transformed address bits and is operably coupled to a dimension of a memory array.

The memory array may be programmed with data including or consisting essentially of music, video, computer software, a computer application, reference data, text, and/or a diagram. The decoder and the memory array may be disposed within a removable memory storage device. The memory array may include or consist essentially of a plurality of storage cells. At least one of the storage cells may include or consist essentially of a phase-change material. The data will typically include error correcting bits, but might not in some cases.

In another aspect, embodiments of the invention feature a method of forming a memory-array that receives as input through address transforming logic whereby a plurality of transformed address lines is operably coupled to a memory array comprising rows and columns through decoders. The method includes or consists essentially of providing an address input to transforming logic the output of which is provided to decoders to access the memory array.

In yet another aspect, embodiments of the invention feature a method of transforming an address by adding bits comprised by a first portion of the address field into bits comprised by a second portion of the address field.

Embodiments of the invention may include one or more of the following. Transforming logic may include adders. Transforming logic may include comparators or exclusive-or circuits. Adders may include overflow carry bits that are discarded, ignored, or otherwise not used or the overflow logic may be omitted altogether. The requirement is that for any complete set of input addresses, each memory location must be selected once and only be selected once.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawing, in which.

DETAILED DESCRIPTION

Figure 1:
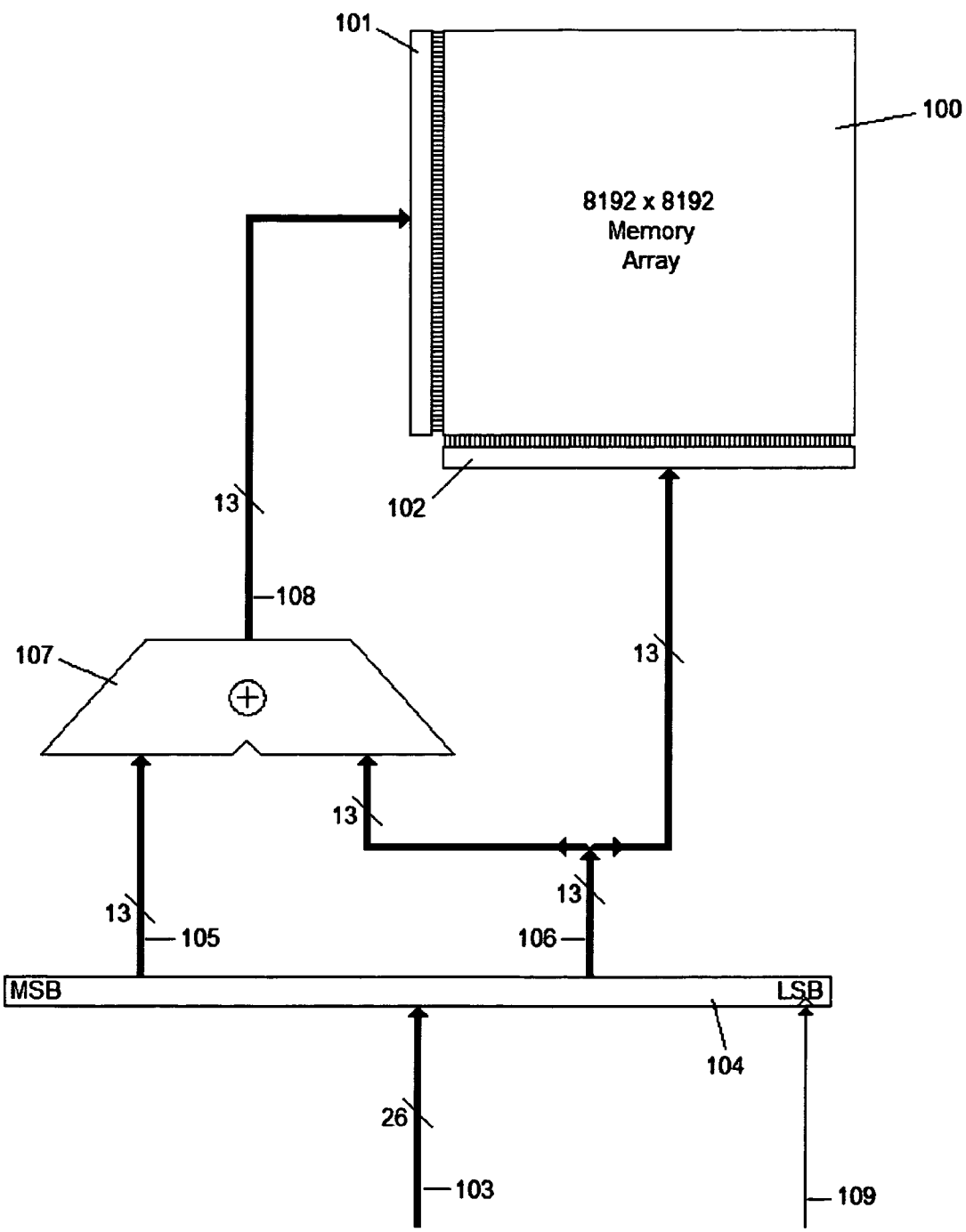
FIG. 1 is an exemplary circuit diagram of a diagonally accessed memory array in accordance with an embodiment of the invention.

The diagonally accessed memory array (DAMA) is addressed much like a conventional memory. The address of a DAMA can be broken into fields. These fields translate into the memory's internal decoding. In its simplest form, the low order address bits are grouped into a field that translate into a one of N selection of the rows in the array and the high order address bits are grouped into a field that translate into a one of M selection of the columns in the array. (As one skilled in the art will realize, the references in this description to rows and columns is arbitrary and a can be interchanged in a design whereby the array is in essence rotated by 90 degrees.)

In a conventional memory, bit access is performed by scanning the array as one would read a book—left to right and top to bottom. Each successive bit is accessed by incrementing the address from the previous bit address. When the bits are scanned from left to right, the column bits field of the address is increased by one. When the right edge of the array is reached, the scan continues by wrapping back to the left side and dropping down a row. Mathematically, this is consistent with simply incrementing the full address because, when the right side of the array is reached (at the final column at which point the column field part of the address will contain all '1' bits) and the address is incremented to next bit in the array, the column field will overflow to all '0' bits (thereby changing the column selection from the last, rightmost column in the array to the first, leftmost column) and a carry will increase the row field by one (thereby dropping the selected row down to the next row in the array). Furthermore, when the bottom right corner of the array is reached, an increment causes an overflow carry beyond the MSB of the address space and, by ignoring this overflow carry, the scan continues at address 0 at the top left corner of the array. It is as if the bottom row of the array were adjacent to (just above) that top row (think of the memory array as being a square of paper rolled into a tube). In other words, taking for example's sake an array that is 8192 rows by 8192 columns, after accessing the first 8192 bits in order, the 26 bit binary address is: 0000000000000|1111111111111 and this becomes 0000000000001|0000000000000 after one additional increment (note the vertical bar symbol, |, has been inserted to indicate the division between the first and last 13 bits corresponding to the row and column address fields, respectively). The lowest order bit of the row field (the 14th bit or A13) has a decimal value of 8192; to increment the row while retaining the same column, the address would be increased by 8192 (i.e., add 0000000000001|0000000000000 or, in hexadecimal, 0x0002000). Now, it can be seen that to advance both the row and the column simultaneously (i.e., diagonally access), the address would be increased by 8193 or, in hexadecimal, by 0x0002001 (i.e., adding 0x0000001 to advance the column and adding 0x0002000 to advance the row).

In the DAMA, to achieve the pure diagonal access pattern, each time the column field is incremented the row field must likewise be incremented. This results in a diagonal placement of the bits in the array where any one bit is located down one row and over one column from the previously addressed bit in sequential address order. Each scan line across the array is located one bit below the previous scan line, albeit a diagonal line. When either the right side or the bottom of the array is reached, we still think of the memory array as a square of paper rolled into a vertical or horizontal tube, respectively, and the scanning wraps.

In FIG. 1, we take a closer look at the addressing of an exemplary DAMA. The array 100, for the sake of this example, is 8K×8K which, like the example above, means there are 8192 rows and 8192 columns in the array. As such, the columns are numbered 0 through 8191 and the rows are numbered 0 through 8191. An 8K×8K array would be addressed with a 26 bit address whereby the lower 13 bits 106 are decoded by a column address decoder/selector 102 to select a column and the upper 13 bits 105 are decoded by a row address decoder/selector 101 to select a row. The 26 bit address 103 as passed to the memory circuit (from elsewhere in the same chip or from an external address bus) is held in a latching device 104 (such as a register or a loadable counter). In the figure the address bus 103 is depicted to be 26 bits wide and no control logic for loading the device 104 is shown; a typical implementation could alternatively have a different sized address bus—such as 8 bits—and these address bytes could be loaded into the latching device 104 in four operations. In a conventional sequentially accessed memory, that latching device 104 would typically be a loadable counter whereby the address is incremented by pulsing a clock input 109 to loadable counter 104 to address and access the next logical location in order.

With a conventional memory array, there would be no adder logic 107 and the latched upper 13 address bits 105 would simply pass directly to the row decoder/selector 101. With a DAMA memory array, the latched lower 13 address bits 106 not only go directly to column address decoder/selector 102, but also to adder 107 where, in a 13 bit addition operation, they are added to the 13 upper address bits. This sum is then passed to the row address decoder/selector 101.

From the stand point of the address input bus, one thinks of each absolute address as a 26 bit binary number that corresponds to a given single data bit location out of 67 Mb where those 67M data bits are in a specific sequential order and that order corresponds to a sequential count of the absolute address. The actual address can comprise more address bits where any extra address bits select among higher order decoding such as to select one memory array tile from among many tiles or to select one memory layer in a 3-D memory array from among many layers. these extra address bits can be of greater or lesser significance in the total address space. Furthermore, multiples tiles (e.g., eight or sixteen) can be accessed in parallel using the same lower address bits and upper address bit resultant sum such that the same locations in multiple tiles are accessed in parallel as would be the case for certain byte-wise or word-wise (or other sized) accesses. The DAMA chip will then have the ability to be accessed through Random-Access Addressing (RAA) as well as through Sequential Addressing (SEQ). When accessing the data in order by means of RAA access mode, the absolute address would be provided to the DAMA chip for each access and the controller would add 1 to that address between each access. When accessing the data in order by means of SEQ access mode, the absolute address of the first data location in the order would be provided to the DAMA chip and then the DAMA will internally determine the location of each subsequent datum using its sequencer logic. It is essential, therefore, that the addressing order accesses the datum in the same order during RAA mode as the DAMA chip accesses the datum during SEQ mode. In other words, sequentially accessing X number of bytes from the start of the array using the DAMA's internal SEQ mode should end up accessing the same location as directly accessing location X using RAA mode.

In the simplest implementation, the DAMA pages will start on page boundaries and the lower P bits of the column address field (where $2^P$=the page size) at a page boundary will all be zero. For the simple diagonal access addressing described above, it is possible to derive the physical address in the DAMA from the absolute address by adding the lower P bits of the column address field onto the lower P bits of the row address field (without carry to row address bit P+1). In so much as the simplified DAMA has no addition logic, this addition operation should be performed by the controller at the point where the address is supplied to the DAMA chip, however, a more sophisticated DAMA according to the present invention incorporates this addition logic to facilitate a more traditional random-access-like mechanism.

A single 8K×8K ($2^{13} \times 2^{13} = 2^{26} = 67,108,864$ bits) tile within the DAMA memory space can be divided into 262,144 ($2^{18}$) pages of 256 ($2^8$) data bits. With every RAA and SEQ access, all 16 tiles are operated in parallel with one bit accessed per tile resulting in accesses on a word (or double Byte) basis. Having 256 bits per tile per page and 16 tiles, results in 512 bytes per page and this is consistent with a Fat32 file system wherein each sector is 512 Bytes.

Figure 2:
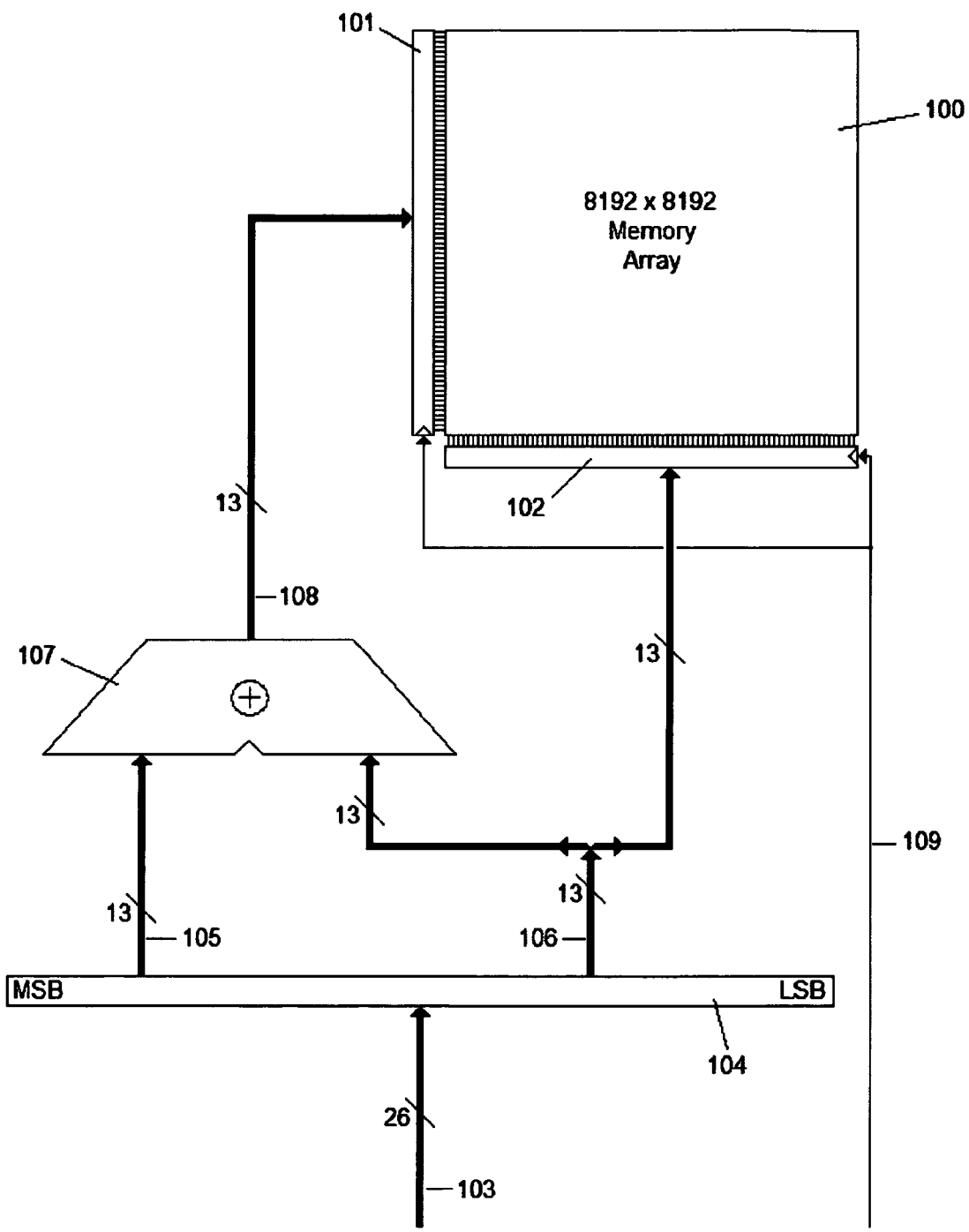
FIG. 2 is an exemplary circuit diagram of a diagonally accessed memory array in accordance with an alternate embodiment of the invention.

In FIG. 2, an alternative embodiment is depicted. The 26 bit address 103 as passed to the memory circuit (from elsewhere in the same chip or from an external address bus) is held in a latching device 104 (such as a register). From this 26 bit address, the lower 13 bits 106 are decoded by an incrementing column address decoder/selector 102 to select a column and the upper 13 bits 105 are decoded by an incrementing row address decoder/selector 101 to select a row. In this variation, the address bits for the rows and columns would be held (latched) in loadable incrementing decoding latches such that a pulse to advance to a next location on the clock input 109 will advance the row address bits and the column address bits with separate latch/counter/decoder logic. In the figure the address bus 103 is depicted to be 26 bits wide and no control logic for loading the device 104 nor the loadable incrementing decoding latches 101 & 102 is shown. Alternatively, the 26 bit address bus could be brought in all at once thereby enabling the elimination of load latch 104.

Embodiments of the present invention will typically, though not necessarily, be built as integrated circuits. Embodiments may be implemented with traditional transistor memory cell bases arrays or with cross-point memory arrays; these arrays may be one of many tiles or sub-arrays in a larger device or an array within a three-dimensional arrangement of arrays or tiles. The storage cells may include various non-linear elements, e.g., transistors, field-emitters, diodes, or any other device that conducts current better in one direction than the other for a given applied voltage. The storage cells may include an element whereby the current they conduct at a particular voltage may be different once a threshold voltage has been exceeded (such as an SCR, a thrysistor, a diac, an ovonic threshold switch (OTS), a four-layer-diode, or the like). The storage element may be a fuse, an antifuse, a phase-change material such as a chalcogenide (including a chalcogenide in which the programmed resistivity may be one of two resistance values and, in the case of more than one bit per cell storage cells, in which the programmed resistivity may be one of three or more resistance values), or a field-emitter element programming mechanism including an element for which the resistance or the volume is changeable and programmable. The phase-change material, such as a Chalcogenide material, may be programmed or erased. Orientation of the array may be rotated, i.e., the "rows" may be "columns," or vice versa. The polarity of the voltages and direction of the steering elements in the storage bits may be reversed while still keeping within what is envisioned by embodiments of the present invention. The present invention may be applied to other memory technologies as well including static RAM, Flash memory, EEPROM, DRAM, and others not mentioned, including memory technologies yet to be commercialized or invented.

Memory devices incorporating embodiments of the present invention may be applied to memory devices and systems for storing digital text, digital books, digital music (such as MP3 players and cellular telephones), digital audio, digital photographs (wherein one or more digital still images may be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the present invention may be embedded or removable, and may be interchangeable among other devices that can access the data therein. Embodiments of the invention may be packaged in any variety of industry-standard form factor, including Compact Flash, Secure Digital, MultiMedia Cards, PCMCIA Cards, Memory Stick, any of a large variety of integrated circuit packages including Ball Grid Arrays, Dual In-Line Packages (DIPs), SOICs, PLCC, TQFPs and the like, as well as in proprietary form factors and custom designed packages. These packages may contain just the memory chip, multiple memory chips, one or more memory chips along with other logic devices or other storage devices such as PLDs, PLAs, micro-controllers, microprocessors, controller chips or chip-sets or other custom or standard circuitry.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A memory device comprising:
   one or more memory arrays each comprising a plurality of memory storage locations;
   an address input for receiving a memory address to be transformed into a physical address within the one or more memory arrays;
   a row address decoder/selector configured to select one or more physical-address locations within the one or more memory arrays along a first dimension;
   a column address decoder/selector configured to select one or more physical-address locations within the one or more memory arrays along a second dimension different from the first dimension; and
   transforming logic configured to (i) transform a first portion of the address received at the address input, thereby forming a transformed address portion, and (ii) direct the transformed address portion to the row address decoder/selector,
   wherein (i) the row address decoder/selector selects physical-address locations based on the transformed address portion and a second portion of the address different from the first portion, (ii) the column address decoder/selector selects physical-address locations based on the first portion of the address, and (iii) the physical-address locations selected by the row address decoder/selector and the column address decoder/selector fall along a generally diagonal path within the one or more memory arrays.

2. The memory device of claim 1, wherein the transforming logic comprises at least one of adder logic, exclusive-or logic, or comparator logic.

3. The memory device of claim 2, wherein (i) the transforming logic comprises adder logic utilizing an overflow carry bit, and (ii) the overflow carry bit is not used or is ignored.

4. The memory device of claim 1, wherein the one or more memory arrays are programmed with data comprising at least one of music, video, computer software, a computer application, reference data, text, or a diagram.

5. The memory device of claim 1, wherein the row address decoder/selector, the column address decoder/selector, and the one or more memory arrays are disposed within a removable memory storage device.

6. The memory device of claim 1, wherein at least one of the memory storage locations comprises a programmable material.

7. The memory device of claim 6, wherein the programmable material comprises a phase-change material.

8. The memory device of claim 7, wherein the phase-change material comprises a chalcogenide material.

9. The memory device of claim 6, wherein the programmable material is reprogrammable or erasable.

10. The memory device of claim 1, wherein at least one of the memory storage locations comprises a non-linear device.

11. The memory device of claim 10, wherein the non-linear device comprises a transistor.

12. The memory device of claim 10, wherein the non-linear device comprises a diode.

13. The memory device of claim 10, wherein the non-linear device conducts current better in one direction than the other for a given applied voltage.

14. The memory device of claim 1, wherein at least one of the memory storage locations is one-time programmable.

15. The memory device of claim 1, wherein at least one of the memory storage locations comprises a fuse.

16. The memory device of claim 1, wherein at least one of the memory storage locations comprises an antifuse.

17. The memory device of claim 1, or more arrays of memory storage locations comprises arrangement of said arrays wherein the one or more memory arrays are arranged in at least one of tiles or layers.

18. The memory device of claim 1, further comprising an address holding circuit configured to receive the memory address from the address input and direct the memory address to the row address decoder/selector, the column address decoder/selector, and the transforming logic, the address holding circuit comprising at least one of a latch, a counter, or an incrementer.

19. A method of accessing a memory device comprising one or more memory arrays each comprising a plurality of memory storage locations, the method comprising:
    receiving a memory address to be transformed into a physical address within the one or more memory arrays;
    transforming a first portion of the received address, thereby forming a transformed address portion;
    selecting physical-address locations within the one or more memory arrays along a first dimension based on the transformed address portion and a second portion of the received address different from the first portion; and
    selecting physical-address locations within the one or more memory arrays along a second dimension based on the first portion of the received address,
    wherein the selected physical-address locations fall along a generally diagonal path within the one or more memory arrays.

* * * * *